United States Patent [19]

Collet et al.

[11] Patent Number: 4,910,626

[45] Date of Patent: Mar. 20, 1990

[54] CURRENT LIMITER

[75] Inventors: Michel Collet, Villeurbanne; Van Doan Pham, Meyzieu; Alain Fevrier, Maurepas, all of France

[73] Assignee: Societe Anonyme dite : Alsthom, Paris, France

[21] Appl. No.: 330,532

[22] Filed: Mar. 30, 1989

[30] Foreign Application Priority Data

Apr. 7, 1988 [FR] France ................................. 88 04603

[51] Int. Cl.$^4$ .............................................. H02H 9/02
[52] U.S. Cl. ......................................... 361/19; 361/58; 361/141; 357/83; 335/216; 505/850; 505/891; 505/881; 174/125.1
[58] Field of Search .................... 361/19, 43, 58, 93, 361/111, 141, 385; 327/360, 908; 505/850, 869, 881, 885, 887, 891, 899; 174/126 S, 15.4, 27, 28; 357/82, 87; 335/216

[56] References Cited

U.S. PATENT DOCUMENTS

| | | | |
|---|---|---|---|
| 3,412,320 | 11/1968 | Marshall | 324/0.5 |
| 3,549,952 | 12/1970 | Sole | 361/141 |
| 3,691,491 | 9/1972 | Massar et al. | 361/50 |
| 4,470,090 | 9/1984 | Carr, Jr. | 361/19 |

Primary Examiner—Todd E. DeBoer
Attorney, Agent, or Firm—Sughrue, Mion, Zinn, Macpeak & Seas

[57] ABSTRACT

A current limiter comprising a cryostat provided with a first insulating feedthrough for an inlet conductor and a second insulating feedthrough for an outlet conductor, and a conductor running from one feedthrough to the other inside the tank, said conductor being constituted at least in part by a superconducting material, the cryostat being filled with a fluid at a temperature which is low enough to maintain said material in the superconducting state, said portion made of superconducting material including at least one portion comprising superconducting wires (7, 8) wound in opposite direction windings on two coaxial insulating formers (14, 15). Respective ends of each of the superconducting wires (7, 8) are connected firstly to the inlet conductor and secondly to the outlet conductor via identical elementary current feeds (21A, 22A).

4 Claims, 2 Drawing Sheets

CURRENT LIMITER

The present invention relates to a superconducting current limiter.

BACKGROUND OF THE INVENTION

Such a current limiter is intended to be used in series with a circuit breaker and serves to greatly reduce the amplitude of fault current by limiting the value of the current it conveys, thereby reducing electrodynamic forces on circuit breaker apparatus and also reducing the energy of the arc to be interrupted therein.

Such a limiter conventionally comprises an element made of a material suitable for taking up the superconducting state, for example but not exclusively niobium-titanium placed in liquid helium.

In the event of current intensity increasing (e.g. due to a short circuit), the current exceeds the critical value and the element returns to a state having a high value of resistance, thereby limiting the current. The superconducting element is generally made in the form of a coiled wire of sufficient size and length to be able to withstand the reestablished voltage for a certain length of time until the series-connected circuit breaker opens.

One difficulty lies in making a coil whose self-inductance is small enough to avoid reactive losses in normal operation. The prior art coil is conventionally constituted by two or four coils connected in series which are wound coaxially in opposite directions relative to one another. This solution is not easily adapted to high tension grids because of the problem of providing insulation between the inlet and the outlet of the coil.

The problem of insulating the inlet and the outlet can be solved by using parallel concentric coils wound in opposite directions, however when using superconducting wires, this solution can give rise to high loop currents because of the substantially zero electrical resistance.

Even when two coils are perfectly wound for minimizing self-inductance, any small internal or external disturbance can give rise to an untimely transition of the superconductor.

The invention proposes a solution which is simple, convenient to implement, and reliable.

SUMMARY OF THE INVENTION

The invention provides a current limiter comprising a cryostat provided with a first insulating feedthrough for an inlet conductor and a second insulating feedthrough for an outlet conductor, and a conductor running from one feedthrough to the other inside the tank, said conductor being constituted at least in part by a superconducting material, the cryostat being filled with a fluid at a temperature which is low enough to maintain said material in the superconducting state, said portion made of superconducting material including at least one portion comprising superconducting wires wound in opposite-direction windings on two coaxial insulating formers, wherein respective ends of each of the superconducting wires are connected firstly to the inlet conductor and secondly to the outlet conductor via identical elementary current feeds.

In a particular embodiment, the elementary current feeds are made from a conducting cylinder or tube provided with slots.

BRIEF DESCRIPTION OF THE DRAWINGS

Embodiments of the invention are described by way of example with reference to the accompanying drawings, in which.

DETAILED DESCRIPTION

Figure 1:
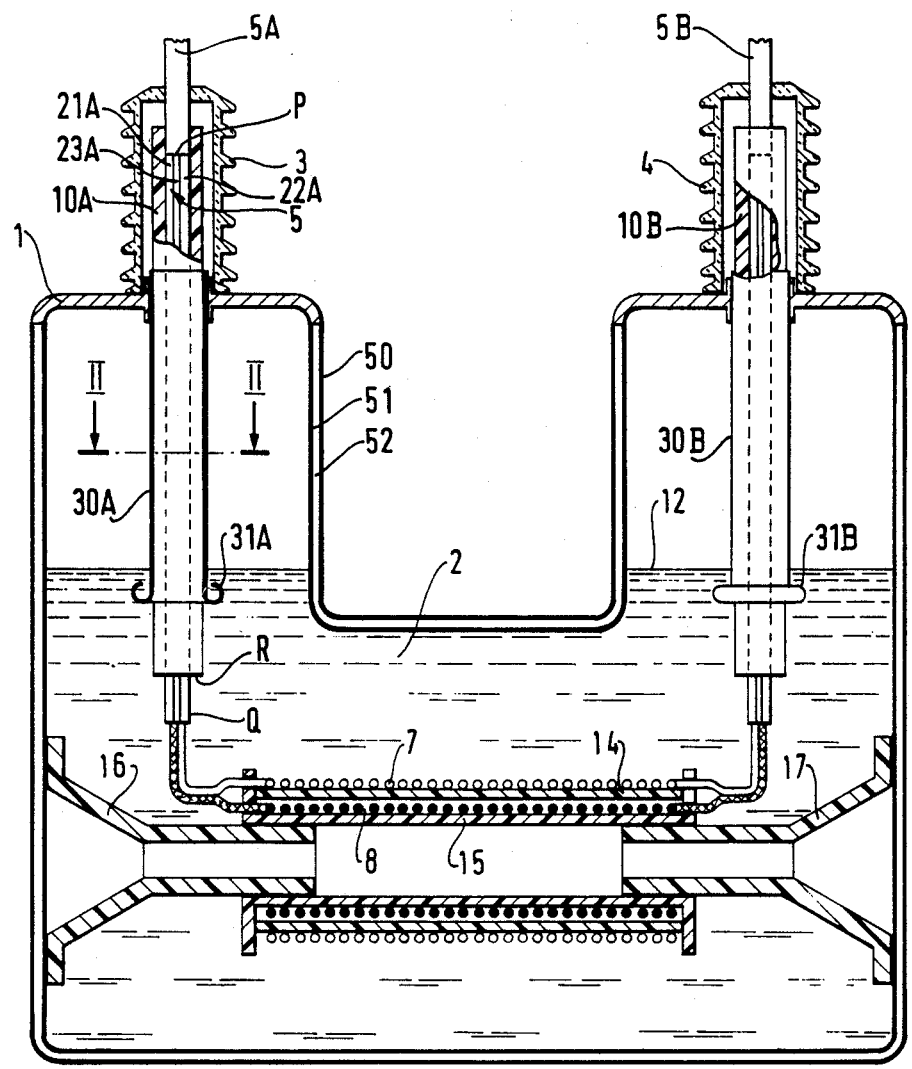
FIG. 1 is an elevation view in section through a current limiter in accordance with the invention.

The limiter comprises a metal cryostat 1 constituted by two walls 50 and 51 separated by a space 52 in which a vacuum is maintained. The cryostat is partially filled with fluid 2 at a temperature enabling the coils used to take up the superconducting state.

If the coils are made of niobium-titanium wire, then the fluid used is liquid helium.

The tank is surmounted by two insulating feedthroughs 3 and 4 through which respective conductors 5A and 5B pass, each of which is fitted with a respective insulating sheath 10A and 10B.

At the top ends of the feedthroughs which are at a temperature close to ambient temperature, the conductors 5A and 5B are made of solid copper.

The current inlet side (to the left in the figures) is now described, since the outlet side is identical. Identical portions of the inlet side bear the index letter A and the corresponding outlet portions bear the index letter B.

Beneath a point P situated above the tank, the conductor 5A is split into two (or more) equal portions over its entire length to a point Q lying in the liquid portion of the fluid.

Figure 2:
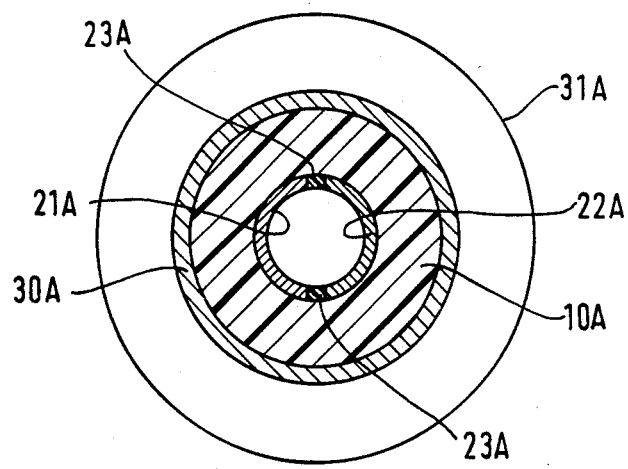
FIG. 2 is a section through a conductor on line II—II of FIG. 1.

FIG. 2 thus shows the conductor 5A which is in the form of a tube being separated into two portions 21A and 22A referred to as elementary current feeds which are electrically insulated from each other by slots 23A filled with solid insulation which may optionally be of the same nature as the insulation of the sheath 10A.

The superconducting wires 7 and 8 of the coil are connected to respective ends of the elementary current feeds 22A and 21A at the point Q.

The insulating sheath 10A extends from the top of the feedthrough to a level R slightly beneath the liquid helium level.

In order to protect the low ambient dielectric performance, it is advantageous to provide the outside of the sheath 10A with a conducting layer 30A connected to the same potential as the tank.

The end of said layer 30A is electrically connected to a guard ring 31A which is situated in the liquid phase.

The end of the insulating sheath 10A is situated at a sufficient distance from the guard ring 31A in order to ensure proper dielectric performance in liquid helium.

Beyond the junctions at Q, the two superconducting wires 7 and 8 have a common portion after which they are wound on respective coaxial insulating sleeves 14 and 15 which are held by insulating supports 16 and 17 fixed to the tank.

The helium flows freely inside these sleeves.

The two wires 7 and 8 are wound on their respective sleeves in opposite directions so as to cancel the overall self-induction of the assembly.

By virtue of the above described disposition, the loop current between the two parallel windings does not see the zero electrical resistance due to superconductivity, but sees a resistance corresponding to about four times the resistance of any one of the elementary current feeds such as 21A.

Figure 3:
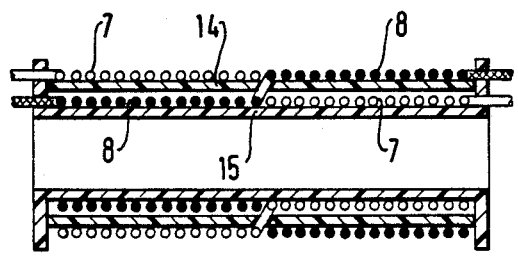
FIG. 3 is a fragmentary view of a variant current limiter in accordance with the invention.

In order to further reduce the inductance of the coil, it is advantageously to cross over the superconducting wires 7 and 8 in the middle of the coils, as shown in FIG. 3.

In accordance with the invention, if the nominal current flowing through the superconducting current limiter is to be increased, then it is necessary merely to increase the number of elementary current feeds and the number of parallel connected superconducting windings by a corresponding amount.

Thus, each end of each superconducting wire corresponds to its own elementary current feed.

The conductor 5 may have 2, 4, 6, or even more elementary current feeds depending on the required nominal current.

The electrical resistance of any one elementary current feed is adjusted by varying its length, its cross section, and its resistivity (copper, aluminum alloy, . . . ). The value of the electrical resistance of an elementary current feed may exceed several hundred micro-ohms.

Figure 4:
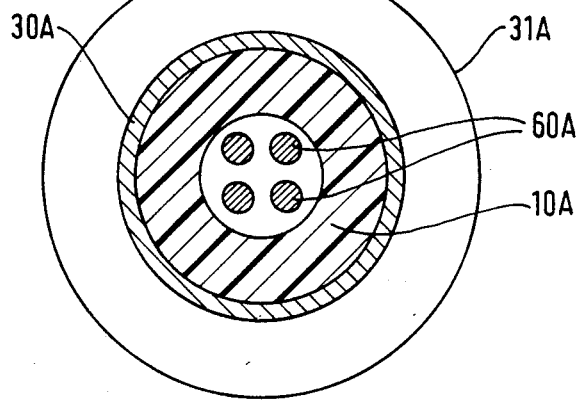
FIG. 4 is a section on line II—II through a variant current feed conductor.

FIG. 4 shows a variant current feed. It is constituted by identical parallel conductor rods 60A disposed symmetrically around a circumference inside the insulating sheath 10A which is partially filled with cooling fluid.

One end of each of the rods 60A is connected to a common conducting plate (not shown) situated at level P (see FIG. 1), while the other end of each rod is connected to a superconducting wire.

The elementary current feeds are held rigidly in place by means of insulating disks provided with holes to allow the cooling fluid to pass and rise inside the sheath 10.

One of these disks is fixed at level R.

In a variant, not shown, the elementary feeds are constituted by coaxial conducting tubes separated by insulation, with one end of each tube being fixed to a common plate and with the opposite end of each tube being fixed to a respective superconducting wire.

We claim:

1. A current limiter comprising a cryostat provided with a first insulating feedthrough for an inlet conductor and a second insulating feedthrough for an outlet conductor, and a conductor means running from one feedthrough to the other inside the tank, said conductor means being constituted at least in part by a superconducting material, the cryostat being filled with a fluid at a temperature which is low enough to maintain said material in the superconducting state, said part made of superconducting material including at least one portion comprising superconducting wires wound in opposite-direction windings on two coaxial insulating formers, wherein respective ends of each of the superconducting wires are connected firstly to the inlet conductor and secondly to the outlet conductor via identical elementary current feeds.

2. A current limiter according to claim 1, wherein the elementary current feeds are made from a conducting cylinder or tube provided with slots.

3. A current limiter according to claim 2, wherein the slots are very narrow and filled with insulation.

4. A current limiter according to claim 1, wherein the superconducting wires are crossed over in the middle of the windings.

* * * * *